US012545998B2

(12) United States Patent
Knisley et al.

(10) Patent No.: US 12,545,998 B2
(45) Date of Patent: Feb. 10, 2026

(54) DEPOSITION OF RHENIUM-CONTAINING THIN FILMS

(71) Applicants: Applied Materials, Inc., Santa Clara, CA (US); Wayne State University, Detroit, MI (US)

(72) Inventors: Thomas Knisley, Livonia, MI (US); Keenan N. Woods, San Ramon, CA (US); Mark Saly, Santa Clara, CA (US); Stefan Cwik, Detroit, MI (US); Charles H. Winter, Bloomfield Hills, MI (US)

(73) Assignees: Applied Materials, Inc., Santa Clara, CA (US); Wayne State University, Detroit, MI (US)

( * ) Notice: Subject to any disclaimer, the term of this patent is extended or adjusted under 35 U.S.C. 154(b) by 207 days.

(21) Appl. No.: 16/874,616

(22) Filed: May 14, 2020

(65) Prior Publication Data

US 2020/0362458 A1    Nov. 19, 2020

Related U.S. Application Data

(60) Provisional application No. 62/847,657, filed on May 14, 2019.

(51) Int. Cl.
 *C23C 16/04* (2006.01)
 *C23C 16/08* (2006.01)
 *C23C 16/455* (2006.01)

(52) U.S. Cl.
 CPC ........ *C23C 16/45527* (2013.01); *C23C 16/04* (2013.01); *C23C 16/08* (2013.01)

(58) Field of Classification Search
 None
 See application file for complete search history.

(56) References Cited

U.S. PATENT DOCUMENTS

| | | | |
|---|---|---|---|
| 8,969,719 B2 | 3/2015 | Munteanu et al. | |
| 9,631,272 B2* | 4/2017 | Li | C23C 16/32 |
| 2001/0009695 A1* | 7/2001 | Saanila | H01L 21/76877 |
| | | | 427/255.39 |
| 2002/0182320 A1* | 12/2002 | Leskela | C23C 16/34 |
| | | | 427/419.7 |
| 2007/0014919 A1* | 1/2007 | Hamalainen | C23C 16/45525 |
| | | | 427/248.1 |
| 2008/0274617 A1* | 11/2008 | Milligan | H01L 21/28562 |
| | | | 438/686 |

(Continued)

FOREIGN PATENT DOCUMENTS

| | | |
|---|---|---|
| CN | 105253917 A | 1/2016 |
| WO | 2007049939 A1 | 5/2007 |
| WO | WO-2017210328 A1 * | 12/2017 ......... G01R 33/0052 |

OTHER PUBLICATIONS

Machine Translation of Description for CN105253917A.

(Continued)

*Primary Examiner* — David P Turocy
(74) *Attorney, Agent, or Firm* — SERVILLA WHITNEY LLC

(57) ABSTRACT

Methods for depositing rhenium-containing thin films on a substrate are described. The substrate is exposed to a rhenium precursor and a reducing agent to form the rhenium-containing film (e.g., metallic rhenium, rhenium nitride). The exposures can be sequential or simultaneous.

13 Claims, 1 Drawing Sheet

(56) References Cited

U.S. PATENT DOCUMENTS

| | | | |
|---|---|---|---|
| 2017/0342553 A1* | 11/2017 | Yu | H01L 21/76826 |
| 2018/0155832 A1* | 6/2018 | Hamalainen | C23C 16/45534 |
| 2020/0194268 A1* | 6/2020 | Sharma | C23C 16/06 |

OTHER PUBLICATIONS

Danopoulos, Andreas A., et al., "t-Butylimido Compounds of Rhenium. X-Ray Crystal Structures Of [(Bu'N), Re(p-NBu')]2, (BdN), ReCl,, (Bu'N), ReCl,C&I,, (Bu'N), Re(OSiMe,) and (Bu'N), ReCl*'", Polyhedron vol. 8, No. 22, pp. 2657-2670, Jun. 7, 1989.

Hamalainen, Jani, et al., "Rhenium Metal and Rhenium Nitride Thin Films Grown by Atomic Layer Deposition", Angew. Chem. Int. Ed. 2018, 57, 14538-14542.

Nugent, William A., "Synthesis of Some d° Organoimido Complexes of the Early Transition Metals", Inorganic Chemistry, vol. 22, No. 6, 1983, Jun. 14, 1982, 965-969.

* cited by examiner

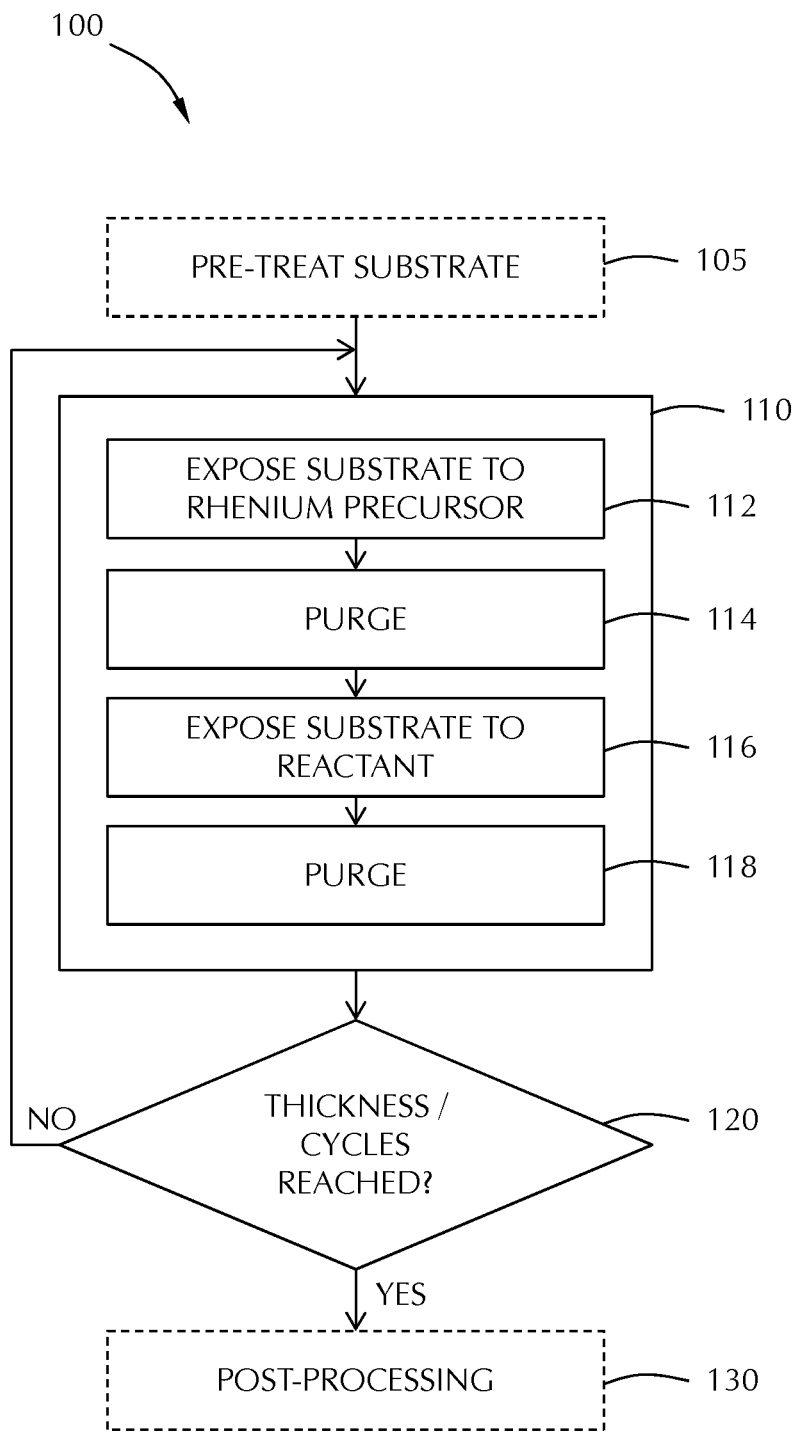

DEPOSITION OF RHENIUM-CONTAINING THIN FILMS

CROSS-REFERENCE TO RELATED APPLICATIONS

This application claims priority to U.S. Provisional Application No. 62/847,657, filed May 14, 2019, the entire disclosure of which is hereby incorporated by reference herein.

TECHNICAL FIELD

Embodiments of the present disclosure generally relate to methods for depositing rhenium-containing thin films. In particular, embodiments of the disclosure are directed to methods of depositing rhenium metal and rhenium nitride thin films by atomic layer deposition.

BACKGROUND

As microelectronic device sizes become smaller, challenges exist with current metal films used for contacts, barrier layers, etc. New metals and metal films are needed for a variety of applications in microelectronic devices. Rhenium has not been previously used in microelectronic applications. Accordingly, there is a need in the art for new methods of depositing rhenium-containing films for microelectronic devices.

SUMMARY

One or more embodiments of the disclosure are directed to methods of depositing a film. A substrate is exposed to a rhenium precursor to deposit a film on the substrate. The processing chamber is purged of the rhenium precursor and the substrate is exposed to a reducing agent to react with the film to form one or more of a metal film or a metal nitride film on the substrate. The processing chamber is then purged of the reducing agent.

Additional embodiments of the disclosure are directed to methods of depositing a film. A metal film is selectively formed by a process cycle comprising sequential exposure of a substrate to a rhenium precursor, purge gas, a reducing agent, and purge gas. The process cycle is repeated to selectively form a rhenium film on the substrate.

Further embodiments of the disclosure are directed to methods of depositing a film comprising selectively forming a rhenium-containing film in a process cycle comprising sequential exposure of a substrate to a rhenium precursor, purge gas, reducing agent, and purge gas.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

The FIGURE shows a flowchart of a processing method in accordance with one or more embodiment of the disclosure.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, lass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

Rhenium (Re) has not been previously used in microelectronic device applications. Rhenium metal can be grown by atomic layer deposition for many applications. One or more embodiments of the disclosure advantageously provide processes for atomic layer deposition to form rhenium-containing films. As used in this specification and the appended claims, the term "rhenium-containing film" refers to a film that comprises rhenium atoms and has greater than or equal to about 1 atomic % rhenium, 2 atomic % rhenium, 3 atomic % rhenium, 4 atomic % rhenium, 5 atomic % rhenium, 10 atomic % rhenium, or 15 atomic % rhenium. In some embodiments, the rhenium-containing film comprises one or more of rhenium metal (zero-valent rhenium) or rhenium nitride (ReN). The skilled artisan will recognize that the use of molecular formula like ReN does not imply a specific stoichiometric relationship between the elements but merely the identity of the major components of the film. For example, ReN refers to a film whose major composition comprises rhenium and nitrogen atoms. In some embodiments, the major composition of the specified film (i.e., the sum of the atomic percents of the specified atoms) is greater than or equal to about 95%, 98%, 99% or 99.5% of the film, on an atomic basis.

Some embodiments of the disclosure advantageously provide thin films with a variety of applications in microelectronic devices. Some embodiments advantageously provide processes of depositing rhenium-containing films having low-resistivity. In some embodiments, the rhenium-containing film has a resistivity less than or equal to about 300 μohm-cm.

Accordingly, with reference to the FIGURE, one or more embodiments of the disclosure are directed to method 100 of depositing a thin film. The method illustrated in the FIGURE is representative of an atomic layer deposition (ALD) process in which the substrate or substrate surface is exposed sequentially to the reactive gases in a manner that prevents or minimizes gas phase reactions of the reactive gases. In some embodiments, the method comprises a chemical vapor deposition (CVD) process in which the reactive gases are mixed in the processing chamber to allow gas phase reactions of the reactive gases and deposition of the thin film.

In some embodiments, the method 100 includes a pre-treatment operation 105. The pre-treatment can be any suitable pre-treatment known to the skilled artisan. Suitable pre-treatments include, but are not limited to, pre-heating, cleaning, soaking and native oxide removal.

At deposition 110, a process is performed to deposit a rhenium-containing thin film on the substrate (or substrate surface). The deposition process can include one or more operations to form a film on the substrate. In operation 112, the substrate (or substrate surface) is exposed to a rhenium precursor to deposit a film on the substrate (or substrate surface). The rhenium precursor can be any suitable rhenium-containing compound that can react with (i.e., adsorb or chemisorb onto) the substrate surface to leave a rhenium-containing species on the substrate surface. In some embodiments, the rhenium precursor comprises one or more of rhenium chloride. As used in this manner, unless otherwise specified, the term "rhenium chloride" refers to rhenium (V) chloride or rhenium pentachloride ($ReCl_5$). In some embodiments, the rhenium-containing precursor comprises one or more of rhenium heptafluoride ($ReF_7$), rhenium hexafluoride ($ReF_6$), rhenium pentafluoride ($ReF_5$), rhenium pentachloride ($ReCl_5$), or rhenium pentabromide ($ReBr_5$). In some embodiments, the rhenium precursor consists essentially of rhenium chloride. As used in this manner, the term "consists essentially of" means that the rhenium precursor comprises greater than or equal to about 95%, 98%, 99% or 99.5% of the stated species, on a molecular basis. The presence of diluent, carrier and/or inert gases, for example, is not taken into consideration in the calculation.

The substrate (or substrate surface) can be any suitable surface. Suitable surfaces include, but are not limited to, silicon (Si), silicon dioxide ($SiO_2$), silicon oxide ($SiO_x$), titanium nitride (TiN), tantalum nitride (TaN), copper (Cu), cobalt (Cu), tungsten (W), ruthenium (Ru), molybdenum (Mo) or combinations thereof.

At operation 114, the processing chamber is purged to remove unreacted rhenium precursor, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the rhenium precursor by any suitable technique including, but not limited to, moving the substrate through a gas curtain to a portion or sector of the processing chamber that contains none or substantially none of the rhenium precursor. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur.

At operation 116, the substrate (or substrate surface) is exposed to a reducing agent to form one or more of a metal film or a metal nitride film. The reducing agent can react with the rhenium-containing species on the substrate surface to form the rhenium-containing film. In some embodiments, the reducing agent comprises one or more of 1,1-dimethylhydrazine (DMH), alkyl amine, hydrazine, substituted hydrazines including, but not limited to, alkyl hydrazine and allyl hydrazine, pyrazoles, substituted pyrazoles or aminopyrrolidine. In some embodiments, the reducing agent consists essentially of one or more of 1,1-dimethylhydrazine (DMH), alkyl amine, allyl hydrazine or aminopyrrolidine. In some embodiments, the alkyl amine is selected from one or more of tert-butyl amine ($tBuNH_2$), isopropyl amine ($iPrNH_2$), ethylamine ($CH_3CH_2NH_2$), diethylamine (($CH_3CH_2)_2NH$) or butyl amine ($BuNH_2$). In some embodiments, the reducing agent comprises one or more of compounds with the formula $RNH_2$, $R_2NH$, $R_3N$, $R_2SiNH_2$, $(R_3Si)_2NH$, $(R_3Si)_3N$, main group alkyls such as alkyl aluminum complexes ($AlR_3$), alkyl gallium complexes ($GaR_3$), alkyl indium complexes ($InR_3$), alkyl thallium complexes ($TlR_3$), a hydride of a main group alkyl such as alkyl aluminum hydride complexes ($AlR_{3-x}H_x$), alkyl gallium hydride complexes ($GaR_{3-x}H_x$), alkyl indium hydride complexes ($InR_{3-x}H_x$), alkyl thallium hydride complexes ($TlR_{3-x}H_x$), where x is 1 or 2, analogues thereof or plasmas thereof; where each R is independently H or an alkyl group having 1-12 carbon atoms. In some embodiments, the alkyl amine consists essentially of one or more of tert-butyl amine ($tBuNH_2$), isopropyl amine ($iPrNH_2$), ethylamine ($CH_3CH_2NH_2$), diethylamine (($CH_3CH_2)_2NH$), butyl amine ($BuNH_2$). In some embodiments, the alkyl amine comprises or consists essentially of a compound with the formula (I)

where at least one of R1-R4 is a hydrocarbon or alkyl silane substituent. In some embodiments, the hydrocarbon has in the range of 1 to 12 carbon atoms, or 1 to 10 carbon atoms, or 1 to 8 carbon atoms, or 2 to 12 carbon atoms, or 2 to 10 carbon atoms, or 3 to 12 carbon atoms, or 3 to 10 carbon atoms, or 4 to 12 carbon atoms or 4 to 10 carbon atoms. In some embodiments, the reducing agent comprises, or consists essentially of, one or more of a primary alcohol, a secondary alcohol or a tertiary alcohol.

At operation 118, the processing chamber is purged after exposure to the reducing agent. Purging the processing chamber in operation 140 can be the same process or different process than the purge in operation 120. Purging the processing chamber, portion of the processing chamber, area adjacent the substrate surface, etc., removes unreacted reducing agent, reaction products and by-products from the area adjacent the substrate surface.

At decision 120, the thickness of the deposited film, or number of cycles of rhenium-precursor and reducing agent is considered. If the deposited film has reached a predetermined thickness or a predetermined number of process cycles have been performed, the method 100 moves to a post-processing operation 130. If the thickness of the deposited film or the number of process cycles has not reached the predetermined threshold, the method 100 returns to operation 110 to expose the substrate surface to the rhenium precursor again in operation 112, and continuing.

The post-processing operation 130 can be, for example, a process to modify film properties (e.g., annealing) or a further film deposition process (e.g., additional ALD or CVD processes) to grow additional films. In some embodiments, the post-processing operation 130 can be a process that modifies a property of the deposited film. In some embodiments, the post-processing operation 130 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)). Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film.

The method 100 can be performed at any suitable temperature depending on, for example, the rhenium precursor, reducing agent or thermal budget of the device. In some embodiments, exposures to the rhenium precursor (operation 112) and the reducing agent (operation 116) occur at the same temperature. In some embodiments, the substrate is maintained at a temperature in a range of about 300° C. to about 500° C., or in the range of about 350° C. to about 400° C.

In some embodiments, exposure to the rhenium precursor (operation 112) occurs at a different temperature than the exposure to the reducing agent (operation 116). In some embodiments, the substrate is maintained at a first temperature in a range of about 300° C. to about 500° C. for the exposure to the rhenium precursor, and at a second temperature in the range of about 300° C. to about 500° C. for exposure the reducing agent.

In the embodiment illustrated in the FIGURE, deposition operation 110 the substrate (or substrate surface) is exposed to the rhenium precursor and the reducing agent sequentially. In another, un-illustrated, embodiment, the substrate (or substrate surface) is exposed to the rhenium precursor and the reducing agent simultaneously in a CVD reaction. In a CVD reaction, the substrate (or substrate surface) can be exposed to a gaseous mixture of the rhenium precursor and reducing agent to deposit a rhenium-containing film having a predetermined thickness. In the CVD reaction, the rhenium-containing film can be deposited in one exposure to the mixed reactive gas, or can be multiple exposures to the mixed reactive gas with purges between.

In some embodiments, the rhenium-containing film formed comprises rhenium metal. Stated differently, in some embodiments, the rhenium-containing film comprises a metal film comprising rhenium. In some embodiments, the metal film consists essentially of rhenium. As used in this manner, the term "consists essentially of rhenium" means that the rhenium-containing film is greater than or equal to about 80%, 82.5%, 85%, 87.5%, 90%, 92.5%, 95%, 98% or 99% rhenium, on an atomic basis. Measurements of the composition of the rhenium-containing film refer to the bulk portion of the film, excluding interface regions where diffusion of elements from adjacent films may occur.

In some embodiments, the rhenium-containing thin film comprises or consists essentially of rhenium, the rhenium precursor comprises, or consists essentially of, rhenium chloride ($ReCl_5$), the reducing agent comprises, or consists essentially of, 1,1-dimethyl hydrazine, and the substrate is maintained at a temperature greater than or equal to ($\geq$) 400° C.

In some embodiments, the rhenium-containing film comprises or consists essentially of rhenium, the rhenium precursor comprises, or consists essentially of, rhenium chloride ($ReCl_5$), the reducing agent comprises, or consists essentially of, tert-butylamine, and the substrate is maintained at a temperature $\geq$375° C.

The deposition temperature can be modified to change the composition of the rhenium-containing film. At lower temperatures, the inventors have found that a lower deposition temperature using the same reducing agent can result in formation of a ReN film instead of a Re metal film. In some embodiments, the rhenium-containing film is a metal nitride film. In some embodiments, the metal nitride film comprises or consists essentially of rhenium nitride. In some embodiments, the rhenium precursor comprises, or consists essentially of, rhenium chloride ($ReCl_5$), the reducing agent comprises, or consists essentially of, 1,1-dimethyl hydrazine, and the substrate is maintained at a temperature in a range of about 300° C. to less than about 400° C. In some embodiments, the rhenium-containing film comprises ReN with a nitrogen content greater than or equal to about 5%, 7.5%, 10%, 12.5 or 15%, on an atomic basis. In some embodiments, the rhenium-containing film comprises a nitrogen content in the range of about 2% to about 30%, or in the range of about 3% to about 25%, or in the range of about 4% to about 20%, on an atomic basis.

The deposition operation 110 can be repeated to form a metal film or a metal nitride film having a predetermined thickness. In some embodiments, the deposition operation 110 is repeated to provide a metal film or a metal nitride film having a thickness in the range of about 5 Å to about 10 nm, or in the range of about 30 Å to about 3000 Å.

Some embodiments of the disclosure provide metal nitride films with high resistivity. In some embodiments, the resistivity of the rhenium nitride film is in the range of about 80 μΩ-cm to about 300 μΩ-cm. In some embodiments, the rhenium nitride film has a resistivity less than or equal to about 300 μΩ-cm, 250 μΩ-cm, 200 μΩ-cm or 150 μΩ-cm. In some embodiments, the rhenium nitride film has a resistivity greater than or equal to about 80 μΩ-cm, 90 μΩ-cm, 100 μΩ-cm, 110 μΩ-cm, 120 μΩ-cm or 130 μΩ-cm.

Some embodiments of the disclosure are directed to methods of selectively depositing a rhenium-containing metal film. In some embodiments, the rhenium-containing metal film is selectively deposited on a titanium nitride film relative to a silicon oxide film. In some embodiments, the rhenium-containing metal film is selectively deposited on a nitride film relative to an oxide film at a temperature less than about 400° C. In some embodiments, the rhenium-containing metal film is deposited selectively on a cleaned metal film relative to an oxide film.

One or more embodiments of the disclosure are directed to methods of depositing rhenium-containing metal films in high aspect ratio features. A high aspect ratio feature is a trench, via or pillar having a height:width ratio greater than or equal to about 10, 20 or 50. In some embodiments, the rhenium-containing metal film is deposited conformally on the high aspect ratio feature. As used in this manner, a conformal film has a thickness near the top of the feature that is in the range of about 80-120% of the thickness at the bottom of the feature.

Some embodiments of the disclosure are directed to methods for bottom-up gapfill of a feature. A bottom-up gapfill process fills the feature from the bottom versus a conformal process which fills the feature from the bottom and sides. In some embodiments, the feature has a first material at the bottom (e.g., a nitride) and a second material (e.g., an oxide) at the sidewalls. The rhenium-containing method film deposits selectively on the first material relative to the second material so that the metal film fills the feature in a bottom-up manner.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reducing agent). According to one or more embodiments, a purge gas is injected at the exit of the deposition chamber to prevent reactants (e.g., reducing agent) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method consisting of:
selectively forming a zero-valent rhenium film on a substrate surface:
exposing the substrate surface consisting of a first material and a second material to a rhenium precursor in a processing chamber, wherein the first material is a metal film or a nitride film, and the second material an oxide film;
purging the processing chamber of the rhenium precursor;
exposing the substrate surface to a reducing agent to form the zero-valent rhenium film on the substrate surface, the zero-valent rhenium film selectively forming on the first material relative to the second material; and
purging the processing chamber of the reducing agent, wherein the reducing agent comprises an alkyl amine.

2. The method of claim 1, wherein the rhenium precursor comprises one or more of rhenium heptafluoride ($ReF_7$), rhenium hexafluoride ($ReF_6$), rhenium pentafluoride ($ReF_5$), rhenium pentachloride ($ReCl_5$), or rhenium pentabromide ($ReBr_5$).

3. The method of claim 1, wherein the material silicon (Si), copper (Cu), cobalt (Co), tungsten (W), ruthenium (Ru), or molybdenum (Mo).

4. The method of claim 1, wherein the first material comprises the nitride film.

5. The method of claim 4, wherein the first material titanium nitride (TiN) and the second material comprise sis silicon oxide ($SiO_2$).

6. The method of claim 1, wherein exposing the substrate surface to the rhenium precursor occurs at a temperature in a range of about 300° C. to about 500° C.

7. The method of claim 1, wherein exposing the substrate surface to the reducing agent occurs at a temperature in a range of about 300° C. to about 500° C.

8. The method of claim 1, wherein purging the processing chamber comprises flowing a purge gas over the substrate surface.

9. The method of claim 1, wherein the substrate surface is exposed to the rhenium precursor and the reducing agent simultaneously.

10. The method of claim 1, wherein the substrate surface is exposed to the rhenium precursor and the reducing agent sequentially.

11. The method of claim 1, wherein the alkyl amine is selected from one or more of $RNH_2$, $R_2NH$, $R_3N$, $R_2SINH_2$, $(R_3Si)_2NH$, $(R_3Si)_3N$ and analogues, where each R is independently H or an alkyl group having 1-12 carbon atoms.

12. The method of claim 11, wherein the alkyl amine comprises one or more of tert-butyl amine ($^tBuNH_2$), isopropyl amine ($iPrNH_2$), ethylamine ($CH_3CH_2NH_2$), diethylamine (($CH_3CH_2)_2NH$), or butyl amine ($BuNH_2$).

13. A method consisting of:
selectively forming a zero-valent rhenium film on a substrate surface by:
exposing the substrate surface consisting of a first material and a second material to a rhenium precursor in a processing chamber, wherein the first material is titanium nitride (TiN), and the second material is silicon oxide ($SiO_2$);
purging the processing chamber of the rhenium precursor;
exposing the substrate surface to a reducing agent to form the zero-valent rhenium film on the substrate surface, wherein the zero-valent rhenium film selectively forms on the first material relative to the second material; and
purging the processing chamber of the reducing agent, wherein the reducing agent comprises an alkyl amine.

* * * * *